Figure 1:
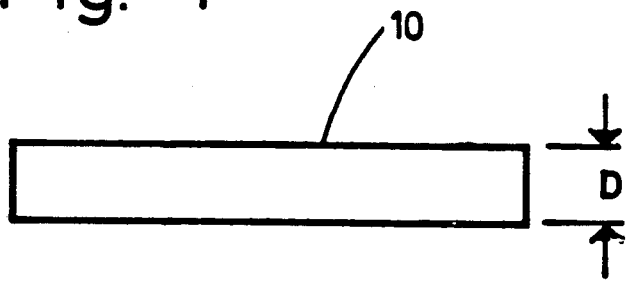

United States Patent [19]

Wisotzki

[11] Patent Number: 5,243,620
[45] Date of Patent: Sep. 7, 1993

[54] HIGH POWER REFLECTORS FOR LASER TECHNOLOGY

[76] Inventor: Jürgen Wisotzki, Weserstrasse 7a, 6074 Rödermark /W-Deutschland, Fed. Rep. of Germany

[21] Appl. No.: 281,945

[22] Filed: Dec. 6, 1988

Related U.S. Application Data

[63] Continuation of Ser. No. 837,868, Nov. 13, 1985, abandoned, which is a continuation of Ser. No. 522,336, Aug. 10, 1983, abandoned.

[30] Foreign Application Priority Data

Aug. 10, 1982 [DE] Fed. Rep. of Germany ....... 3229697
Apr. 8, 1983 [DE] Fed. Rep. of Germany ....... 3312595

[51] Int. Cl.$^5$ ............................ G02B 5/08; G02B 7/18
[52] U.S. Cl. ...................................... 372/99; 359/5.46; 359/838
[58] Field of Search .................... 219/121 LQ; 372/99; 359/838

[56] References Cited

U.S. PATENT DOCUMENTS

| | | | |
|---|---|---|---|
| 4,192,695 | 3/1980 | Mahalla | 148/32 |
| 4,214,818 | 7/1980 | Choyke et al. | 350/288 |
| 4,312,667 | 1/1982 | Guertin | 75/72 |
| 4,679,915 | 7/1987 | Kriz et al. | 350/609 |

FOREIGN PATENT DOCUMENTS

| | | |
|---|---|---|
| 3229697 | 6/1987 | Fed. Rep. of Germany . |
| 52150789 | 12/1977 | Japan . |
| 62-205301 | 9/1987 | Japan . |
| 63-080202 | 4/1988 | Japan . |
| 63-296001 | 12/1988 | Japan . |

OTHER PUBLICATIONS

Choyke et al, "SiC, a New Material for Mirrors", Sep. 1976, pp. 2006-2007, Appl. Opt., vol. 15, #9.
Leshenyuh et al, "Crystal Reflectors as ... Lasers", pp. 769-771, Journ. of Appl. Spect., vol. 22, #6.
Rofin, "Zirconium-Copper Mirrors ... Lasers", 71, pp. 871, ad by Oriel Corp. of Stamford, Conn.
Blevins et al, "Plated Copper Substrates ... CO2 Laser System", Conf. Proc. Soc. Photo-Opt. Inst. Eng., L. A., Calif., Jan. 23, 1979 pp. 125-130.

Primary Examiner—Nelson Moskowitz
Attorney, Agent, or Firm—Larson & Taylor

[57] ABSTRACT

A polished high-intensity reflector of copper, silver or gold for laser applications. In contrast to known mirrors of electrolytic copper whose surface is permeated with grain interfaces, this new mirror is constituted by the surface of single crystals. This surface may be polished. Alternatively this surface may be formed by copper single crystals etched in the (100)- or (111)-orientation planes. In the latter case crystallites making up the surface contain etching pits each of which form small spherical mirrors of their own. Mirrors with etched surface withstand higher laser energies than mirrors with polished surface. As a shield protecting against laser beams several single crystal mirrors may be combined in arrays. The reflecting surface may be either flat or curved.

6 Claims, 1 Drawing Sheet

HIGH POWER REFLECTORS FOR LASER TECHNOLOGY

This application is a continuation of application Ser. No. 837,868 filed Nov. 13, 1985, now abandoned which is a continuation of Ser. No. 522,336 filed Aug. 10, 1983, now abandoned.

This invention concerns high-intensity reflectors (made) of copper, silver or gold for laser applications.

Reflectors hitherto used in laser applications are made of electrolytic copper or OFHC-copper in which maximum reflectivity of incident light is achieved by surface polishing. The material in such conventional reflectors does not have a regular structure. Thus, on the polished surface there are grain boundaries which enclose impurities causing light absorption and scatter. Moreover, grain boundaries constitute areas for attacks by oxidation. When polished they (these areas) will be partially smeared over and covered by vacuum evaporation of coatings.

The purpose of this invention is to provide reflectors of higher efficiency, suitable for higher energy loadings in laser applications. For attaining this objective it is proposed to make reflectors composed of single crystal surfaces.

Single crystals used in such applications are mainly those made of copper, silver and gold of 99.999% purity.

Experiments involving single crystal reflectors of various diameters and shapes yielded the following findings:

At present, lasers attain energies in the order of several Gigawatt/cm$^2$. Laser beams cover very small cross-sectional areas, e.g. 0.6×0.4 mm. Such high-energy, intensily focussed beams result in destruction of all conventional reflectors (consisting) of OFHC-copper and of other materials. Interaction between several favorable factors appears to account for the higher intensities obtainable from single crystal reflectors. The foremost factor appears to be that the regular single crystal structure represents surfaces which allow more homogenous polishing and higher reflectivity. In addition, the lower residual non-reflected but absorbed radiation energy can be diffused more quickly by virtue of better heat dissipation and distributed to the surrounding area as there are no grain boundaries in the single crystal.

Comparative tests of electrolytic and OFHC-copper reflectors with single crystalline copper reflectors according to this invention yielded reflectivity better by approx. 1%.

Single crystal reflectors of silver or gold produced reflectivity better by approx. 1.9%.

Given that reflectivity of electrolytic and OFHC-copper reflectors by coating is improved by only 1/10% in laser applications, the improvement of reflectivity through this invention is significant. In addition, cost-intensive coating processes will no longer be called for.

An additional benefit is the longer life of single crystal reflectors as a result of less proneness to oxidation.

By varying the orientation changes in the crystal structure surface are obtained permitting also polarization of incident light.

On the whole, it is found that, under identical polishing treatment, surfaces show improved reflectivity due to the crystalline structure of single crystals.

In order to increase reflector efficiency further it appears appropriate, in the light of the knowledge obtained in the course of development from OFHC-reflectors to single crystal reflectors described above, to improve polishing of reflecting surfaces in order to enhance reflectivity and minimize absorption of radiated energies. However, it was found that measures contrary in character still may yield the desired result. Indeed, it was found that the highest reflectivity of laser beams was attained in mirrors whose reflective surface represents the (100)- or (111)-orientation plane of an etched copper single crystal.

The etched surface appears to the human eye as uneven and not exactly shining as a mirror. For an appreciation of (the nature of) this invention one must still rely on hypothesis. To that end it is useful to recall the conditions pertaining to polished mirrors. High-energy $CO_2$-lasers cause destruction of copper mirrors as a result of surface roughness still remaining after polishing treatment. Under reflection of a laserbeam in the Gigawatt-range residual polishing peaks on the mirror surface play a negative role. Their heat dissipating capacity being smallest they tend to vaporize under high-energy laser bombardment. Evaporated residues, partially plasma, deposit on the mirror surface; it is this deposit that renders the polished surface dull reducing laser beam reflection while increasing absorption and, as a result thereof, the material becomes ineffective as a shield being ultimately destroyed by further laser beam impact.

In terms of laser beam effects surface roughness generated by etching manifestly cannot be compared to residual surface roughness after polishing. One of the initial effects of etching appears rather to consist in removing polishing peaks.

It is further assumed that enlargement of the reflecting surface through etching plays a major role. The etched structure in the (100)-orientation plane of a copper single crystal has nearly square-shaped etch pits in all cubic crystallites forming the surface whereas the etched structure in the (111)-orientation plane has pits of nearly triangular shape. The total area of etching pits is much larger than the polished surface area prior to etching, hence the beam energy per surface area is correspondingly smaller.

Moreover, etching pits act as individual reflectors to incident laser light, thus dispersing and deflecting the incident laser beam in different directions, i.e. scattering it because of their large number and irregularity.

Ultimately the fact may be significant that the incident laser beam falls vertically upon a small portion of etching pits only, as in concave mirrors, nd their surfaces possibly have better reflectivity than surfaces with traces of mechanical polishing.

The reflector formed by each individual etching pit receives only a very small portion of laser energy. For a beam cross-section of 0.24 mm$^2$ and a mean projection surface per etching pit of approx. 11.5 Ångström$^2$ the beam impinges on approx. $2 \cdot 10^{12}$ etching pits or small reflectors. In the case of a beam energy in the order of 1 Gigawatt/m$^2$ each of the reflectors formed by etching pits is subjected to an impact of one-millionth of one Watt. This small share of the laser beam's total energy is largely reflected by the etching pit's surface while the minimal residual amount can be dissipated without damage to the material given the high heat dissipation of copper single crystals and the curved surface area of etching pits being twice as large in relation to the projection plane.

Under a comparative test between polished single crystal copper mirrors and single crystal copper surfaces with etching pits in orientations (100) and (111) the following result was obtained:

As energy source a pulsed laser with 1 Gigawatt/cm$^2$ peak energy and 40 nsec pulse length was used. Already after five shots the polished copper mirror began to show signs of destruction at the mirror surface which increased under the impact of further pulses. Reflectivity as recorded initially diminished with further destruction of the mirror surface.

The etched single crystal copper orientation planes (100) and (111), when subjected to identical laser pulses, showed no destructive effect. No reduction in reflection properties could be observed; however, because of laser beam scatter this could not be confirmed by measurements.

A high-intensity mirror according to this invention is illustrated in the drawing. This shows in FIG. 1 a side-view of a mirror, and in FIG. 2 an enlarged partial cross-section near the etched reflecting surface.

Large-area copper-monocrystals in orientation planes (100) and (111) may be produced in flat or curved sections of extreme thinness. The thickness dimension D shown in FIG. 1 may vary between 0.1 and 10 mm. In the case of yet thinner mirrors care must be taken to ensure adequate heat dissipation with due regard to ambient temperature and to adjacent parts such as components coated with copper foil. Reflecting surfaces of several copper single crystals may be combined into arrays as a shield against laser bombardment. In this manner it is possible to provide effective protection e.g. to sensitive components and control members in satellites and missiles and to other devices that may be vulnerable to laser bombardment.

In the manufacture of high-intensity mirrors acccording to FIG. 1 care must be taken to ensure that the reflecting surface designated 10 in the drawing coincides with the (100)-orientation plane or the (111)-orientation plane of the copper single crystal. As a first step, it is advisable to polish the surface in the traditional fashion, as is customary for such mirrors.

Figure 2:
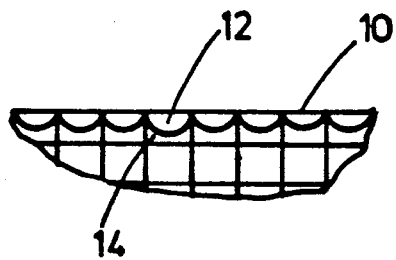

Through this (pre-treatment) larger surface irregularities are removed and some solidification of the material near the surface occurs. Surface 10 will then be etched, again by conventional methods e.g. using nitric acid ($HNO_3$) until the etching structures familiar in single crystals appear in the orientation planes mentioned. FIG. 2 is a schematic illustration of etching pits, designated 12, in individual cubic crystallites 14 of the (100)-orientation plane which constitutes surface 10 of the mirror. As will be noticed, the sum total of curved surfaces of etching pits 12 is much larger than one flat reflector surface 10 and each single etching pit 12 is a small reflector which reflects the incident portion of the laser beam in a specific direction, regardless of the orientation of adjacent reflectors.

Apart from laser optics and for radiation sensors reflectors of the type described in the foregoing are also suitable as shields protecting against laser beams.

I claim:

1. A mirror of copper, silver or gold for providing substantially total reflection of high power $CO_2$ laser beams wherein the mirror comprises the surface of a body of single crystal structure of the same orientation throughout.

2. A mirror as claimed in claim 1 wherein said surface comprises a curved surface.

3. A reflector as claimed in claim 1 wherein said surface comprises a concave curved surface.

4. A protective shield of copper, silver or gold for providing substantially total reflection of high power $CO_2$ laser beams wherein the protective shield comprises the surface of a body of single crystal structure of the same orientation throughout.

5. A protective shield as claimed in claim 4 wherein said surface comprises a curved surface.

6. A protective shield as claimed in claim 4 wherein said surface comprises a concave curved surface.

* * * * *